United States Patent
Shaked et al.

(10) Patent No.: US 9,805,312 B1
(45) Date of Patent: Oct. 31, 2017

(54) USING AN INTEGERIZED REPRESENTATION FOR LARGE-SCALE MACHINE LEARNING DATA

(71) Applicant: Google Inc., Mountain View, CA (US)

(72) Inventors: Tal Shaked, Los Altos, CA (US); Tushar Deepak Chandra, Los Altos, CA (US); Yoram Singer, Palo Alto, CA (US); Tze Way Eugene Ie, San Francisco, CA (US); Joshua Redstone, Cambridge, MA (US)

(73) Assignee: Google Inc., Mountain View, CA (US)

( * ) Notice: Subject to any disclaimer, the term of this patent is extended or adjusted under 35 U.S.C. 154(b) by 744 days.

(21) Appl. No.: 14/105,262

(22) Filed: Dec. 13, 2013

(51) Int. Cl.
*G06N 99/00* (2010.01)
(52) U.S. Cl.
CPC .................................. *G06N 99/005* (2013.01)
(58) Field of Classification Search
None
See application file for complete search history.

(56) References Cited

U.S. PATENT DOCUMENTS

| | | | | |
|---|---|---|---|---|
| 5,099,426 A | * | 3/1992 | Carlgren | G06F 17/30622 704/9 |
| 5,150,119 A | * | 9/1992 | Yoshida | H03M 7/3088 341/106 |
| 5,254,990 A | * | 10/1993 | Yoshida | H03M 7/3088 341/51 |
| 5,502,439 A | * | 3/1996 | Berlin | H03M 7/3086 341/106 |
| 5,864,863 A | * | 1/1999 | Burrows | G06F 17/30622 |
| 5,991,713 A | * | 11/1999 | Unger | H03M 7/3084 704/1 |
| 6,611,924 B1 | * | 8/2003 | Warmink | G06F 11/3624 714/38.12 |
| 7,751,483 B1 | * | 7/2010 | Ganea | H03M 7/3082 375/240.22 |
| 9,081,978 B1 | * | 7/2015 | Connolly | G06F 21/62 |
| 2002/0143521 A1 | * | 10/2002 | Call | G06F 17/2247 704/1 |
| 2003/0028566 A1 | * | 2/2003 | Nakano | G06F 17/30985 715/234 |
| 2004/0225497 A1 | * | 11/2004 | Callahan | H03M 7/3084 704/235 |
| 2005/0273274 A1 | * | 12/2005 | Evans | G06F 19/22 702/20 |
| 2008/0065664 A1 | * | 3/2008 | Kehn | G06F 9/4448 |
| 2009/0210470 A1 | * | 8/2009 | Sarlos | G06K 9/6282 708/400 |
| 2010/0179855 A1 | | 7/2010 | Chen et al. | |
| 2014/0067728 A1 | * | 3/2014 | Ogren | G06F 17/30569 706/12 |

(Continued)

OTHER PUBLICATIONS

Cheng et al. Multimedia Features for Click Prediction of New Ads in Display Advertising. KDD'12, Aug. 12-16, 2012.*

(Continued)

*Primary Examiner* — Lut Wong
*Assistant Examiner* — Robert Bejcek, II
(74) *Attorney, Agent, or Firm* — Fish & Richardson P.C.

(57) ABSTRACT

Methods and systems for replacing feature values of features in training data with integer values selected based on a ranking of the feature values. The methods and systems are suitable for preprocessing large-scale machine learning training data.

15 Claims, 3 Drawing Sheets

(56) References Cited

U.S. PATENT DOCUMENTS

2015/0294187 A1* 10/2015 Sorakado ............ G06K 9/6215
382/195

OTHER PUBLICATIONS

Flach, "The Geometry of ROC Space: Understanding Machine Learning Metrics through ROC Isometrics," In Proceedings of the Twentieth International Conference on Machine Learning, pp. 194-201, 2003.

Hall and Smith, "Practical Feature Subset Selection for Machine Learning," Proceedings of Australasian Computer Science Conference. Springer, Singapore, 1998, pp. 181-191.

Lee et al., "Uncovering Social Spammers: Social Honeypots + Machine Learning," SIGIR'10 Proceedings of the 33rd international ACM SIGIR conference on Research and development in information retrieval, Jul. 19-23, 2010, pp. 435-442.

Marlin, "Collaborative Filtering: A Machine Learning Perspective," M.S. thesis, Department of Computer Science, University of Toronto, 2004, 137 pages.

* cited by examiner

USING AN INTEGERIZED REPRESENTATION FOR LARGE-SCALE MACHINE LEARNING DATA

BACKGROUND

Large-scale data processing may include extracting data of interest from raw data in one or more databases and processing it into a data product. These databases may store a vast number of datasets. As an example, many large-scale machine learning algorithms repeatedly process the same training data which may include 100s of billions of examples and 100s of billions of features. This training data is typically represented as text strings or identifications for interoperability and flexibility. However, when processing these vast amounts of training data, text strings and/or identifications may not be well suited for efficient input-output and in-memory usage.

BRIEF SUMMARY

According to an embodiment of the disclosed subject matter, a method may include receiving a plurality of features associated with a template. The plurality of features may be ranked based on ranking criteria. Next, it may be determined that a first set of features from the plurality of features associated with the template exceeds a threshold ranking criteria. As a result, an integer value may be assigned to each of the first set of features in order based upon ranking.

An implementation of the disclosed subject matter provides a system including a processor configured to receive a plurality of features associated with a template. The plurality of features may be ranked based on ranking criteria. Next, it may be determined that a first set of features from the plurality of features associated with the template exceeds a threshold ranking criteria. Accordingly, an integer value may be assigned to each of the first set of features in order based upon ranking.

Implementations of the disclosed subject matter provide methods and systems that allow for integerized representation for large-scale machine learning data. Because efficient input-output and in memory usage is critical to the overall performance of large-scale data processing systems, conversion of data to integers may reduce memory usage and improve the processing speed of such systems. Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

In general, large-scale data processing systems process large amounts of data from various sources and/or machines. As a specific example, large-scale machine learning systems may process large amounts of training data from data streams received by the system. A data stream may include training data examples corresponding to specific instances of an event or action such as when a user selects a search query, or when a single video is viewed from among multiple videos presented to a user. An example may contain features (i.e., observed properties such as a user being located in the USA, a user preferring to speak English, etc.) and may also contain a label corresponding to a resulting event or action (e.g., a user selected a search result, a user did not select the search result, a user viewed a video, etc.).

A data repository may include one or more logical or physical memory devices that may store a large data set (e.g., potentially over one million instances and/or one hundred thousand features) that may be used, as described in more detail below, to create and train a model. In the description to follow, the data set will be described in the exemplary e-mail context and, thus, data items relating to e-mail may be described. One of ordinary skill in the art would understand how to extend the description to other contexts.

In the exemplary e-mail context, the data set in the data repository will be called "D." D may include multiple elements "d," called instances. Each instance d may include a set of features "X" and a label "Y." In one implementation, the label Y may be a boolean value (e.g., "spam" or "non-spam"), which may be called $y_0$ and $y_1$. In another implementation, the label Y may be a discrete value (e.g., values corresponding to categories of labels).

A feature X may be an aspect of the domain (e.g., the e-mail domain) that may be useful to determine the label (e.g., "the number of exclamation points in the message" or "whether the word 'free' appears in the message"). In one implementation, each feature X may include a boolean value (e.g., a value of zero or one based on whether the word "free" appears in the message). In another implementation, each feature X may include a discrete value (e.g., a value based, at least in part, on the number of exclamation points in the message). In yet another implementation, each feature X may include a real value (e.g., the time of day a message was sent). An instance d may be written as: d:($x_1$, $x_2$, $x_3$, . . . , $x_m$, y), where $x_i$ is the value of the i-th feature $X_i$ and y is the value of the label.

The data repository could potentially store millions of distinct features. For efficiency, an instance d may be encoded using a sparse representation: if $x_i$ is zero, then its value is not stored for d. For example, assume that $X_2$ is the feature "does the word 'free' appear in the message." For a particular instance d, if the word "free" does not appear in the message, then $x_2$ is not stored for d.

A set of instances based on the same or a different set of instances as in the data repository 120 may be used as "training data" D. For each instance d in the training data D, its features $X_0, X_1, \ldots, X_m$) may be extracted. For example, $X_0$ may be the feature corresponding to "the message contains the word 'free.'" In this implementation, the feature $X_0$ may include a boolean value, such that if 'free'" appears in the message, then $x_0$ is one, otherwise $x_0$ is zero. In other implementations, the features may include discrete values. It may be assumed that many of the features will have values of zero. Accordingly, a sparse representation for the features of each instance may be used. In this case, each instance may store only features that have non-zero values.

A machine learning system may be configured according to various arrangements including various components. For example, a machine learning system may contain one or more learners. A learner may include numerous workers such as a mapper or a reducer. A single mapper may receive examples from multiple shards. As an example, a first mapper may receive example A and example B from a data stream. Both examples may contain features F1, F2, and F3. The mapper may generate a first statistic (e.g., associated with a label indicating that a user selected a search result) for F1 based on example A and a second statistic (e.g., associated with a label indicating that a user selected a search result) for F1 based on example B. More specifically, the mapper may indicate a +1 for F1 based on example A and a +1 for F1 based on example B. The two statistics for F1 (i.e., +1 and +1) may be combined at the mapper, resulting in an overall mapper statistic 'MS1' for F1 of +2. Similarly, a different mapper may also receive examples from other data streams, and generate an overall mapper statistic 'MS2' for F1 of +4 based on the respective examples in those data streams.

The overall mapper statistics (e.g., MS1 and MS2) for F1 may be provided to a reducer R1. The reducer R1 may be configured to collect overall mapper statistics from zero or more mappers within the learner and generate a weight based on the collected mapper statistics. The reducer R1 may collect MS1 (i.e., +2) and may also collect MS2 (i.e., +4) and generate the weight +6. Similarly, a second reducer R2 may receive overall mapper statistics for feature F2 and generate a weight of −3. The reducers may provide the weights to a model such that the model contains at least the following:

Model: +6(F1)−3(F2) . . .

As described above, a machine learning system may receive and process 100s of billions of training examples, each example including multiple features. As a result, a machine learning system may store 100s of billions of different features. This vast amount of data and features cannot all be stored in memory and may require persistent storage. These features are typically represented as text strings; however, storing billions of features as text strings can require an unfeasible amount of storage space. Accordingly, better compression of this data is necessary since this data is used to repeatedly train a machine learning system.

Feature hashing is a technique for vectorizing features, i.e. turning arbitrary features into indices in a vector or matrix. This technique is typically performed by applying a hash function to the features and using the resulting hash values as indices directly, rather than looking the indices up in an associative array. There are, however, issues associated with this feature hashing technique. For example, hashing arbitrary features into a fixed byte size representation can lead to collisions and ignores the frequency of occurrence of a feature when generating hash mappings. In addition, hash mappings typically do not compress well and are therefore less compact.

The present disclosure provides methods and systems for using an integerized representation for large-scale machine learning data. Before examples and features are processed by a machine learning system, preprocessing the features and converting them to integers may improve overall performance and in-memory usage of the system. One such preprocessing technique may include, first, categorizing all the features into templates. A template may be a category of feature-types and a template may include multiple features, all of which are from the same category. For example, a template may be "language" and the features included in the template may be English, Spanish, French, German, Hindi, Italian, Japanese, and the like. Each of these features may be associated with a previous example that was received by the system. As another example, a template may be "country" and the features included in the template may include United States, Canada, France, United Kingdom, Mexico, Japan, India, Italy, China, Australia, and the like. Next, for each template, all the features in the template may be ranked based on ranking criteria, such as the frequency of occurrence of each feature, the number of impressions associated with each feature, and the like. This ranking of features may be used to assign integers to specific features. In particular, the smallest integer values may be assigned to the highest ranked features. For example, in an embodiment in which features in a template are ranked by the frequency of occurrence of each feature, the feature occurring most often in a data set may be assigned a relatively low integer, such as 1. In addition, the lowest ranked features may be removed from the template because using these features to construct and/or train a machine learning model typically does not improve modeling performance. In general, representing the training data in this integerized format allows for better compression when stored on disk and may lead to more efficient input-output during processing by the system than is achieved by feature hashing and similar techniques. In addition, implementations disclosed herein allow for fixed width memory data structures to be used in memory, which may decrease memory usage and improve processing speed. Techniques for using an integerized representation of data as disclosed herein may be used in any large-scale data processing system that may benefit from hashing and similar techniques. Further description and examples of large-scale data processing systems and machine learning systems are provided in U.S. Pat. Nos. 8,364,618, and 7,650,331, the contents of each of which are incorporated by reference herein for all purposes, in their entirety.

Figure 1:
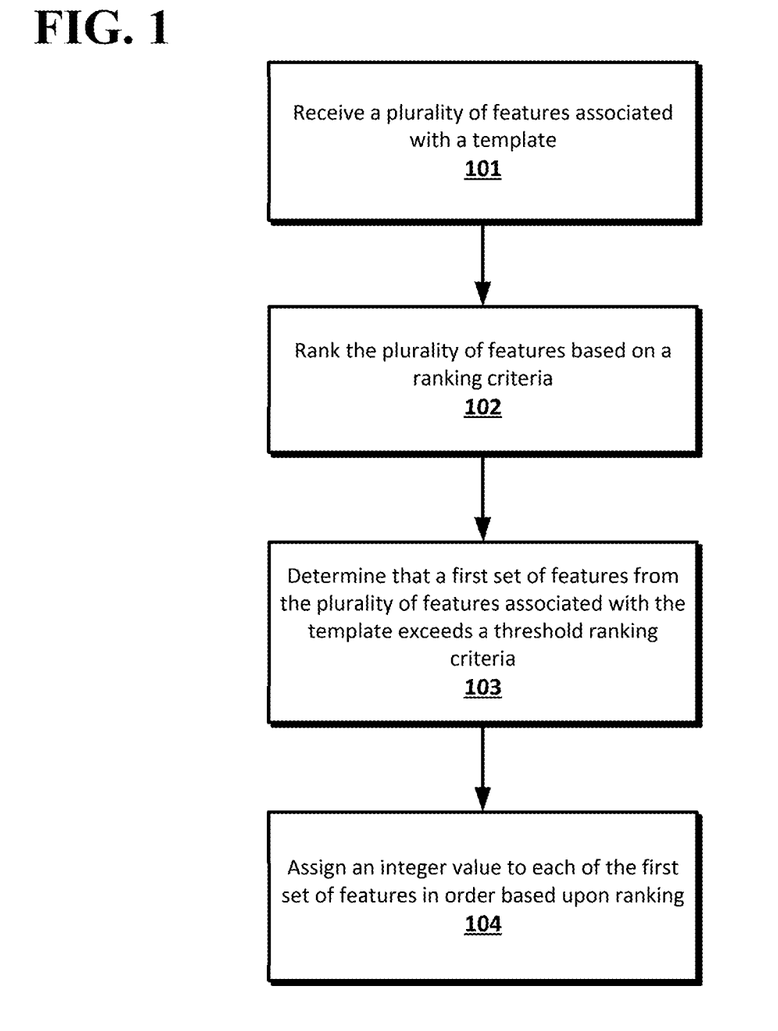
FIG. 1 shows an example process according to an implementation of the disclosed subject matter.

Implementations of the disclosed subject matter provide methods and systems for using an integerized representation for large-scale machine learning data. FIG. 1 shows an example process according to an implementation of the disclosed subject matter. A method may include receiving multiple features associated with a template, at 101. The multiple features may be ranked based on ranking criteria, at 102. Next, it may be determined that a first set of features from among the multiple features associated with the template exceeds a threshold ranking criteria, at 103. As such, an integer value may be assigned to each of the first set of features in order based upon ranking, at 104.

Figure 2:
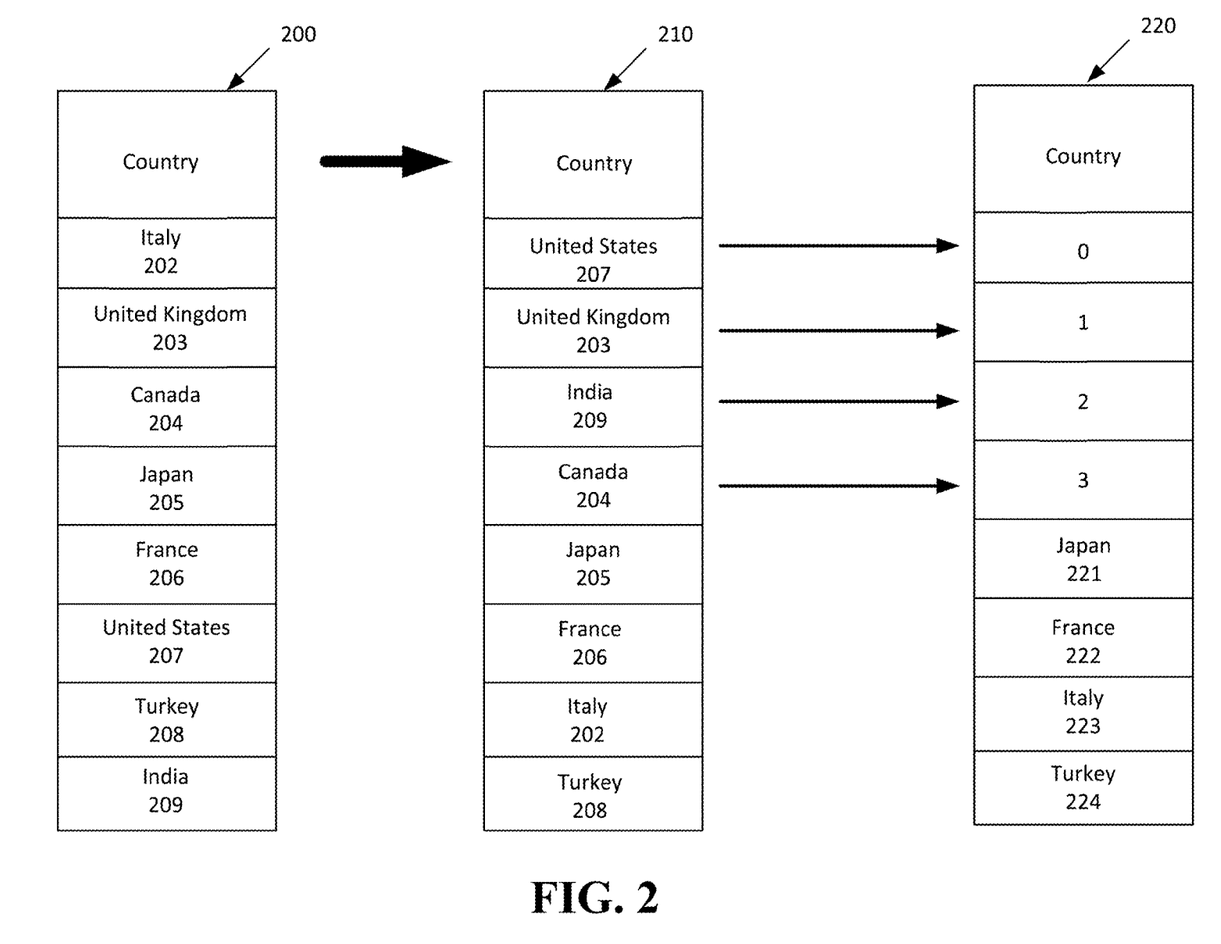
FIG. 2 shows an example template according to an implementation of the disclosed subject matter.

Large-scale machine learning data may be stored according to various database configurations and orientations, such as a column-oriented database, a row-oriented database, a correlation database, and the like. According to an implementation, large-scale machine learning data may be stored in a column-oriented database. A column-oriented database stores data tables as sections of columns of data rather than as rows of data. In a column-oriented database, each column may store multiple data items such as data entries. Examples received by a machine learning system may include zero-to-many features in one or more templates. As a specific example, each column may be associated with a particular template and each of the data entries in the column may include a feature in the template. FIG. 2 shows an example template according to an implementation of the disclosed subject matter. A processor may be configured to receive multiple features associated with a template. For example, a large-scale machine learning system may receive multiple features 202, 203, 204, 205, 206, 207, 208, and 209. In this example, all of the features 202, 203, 204, 205, 206, 207, 208, and 209 are associated with the "Country" template 200 as shown in FIG. 2. In an implementation, the "Country" template 200 may be stored in a column of a column-oriented database. As shown in template 200, each of the received features may be text strings. Additionally, the features Italy 202, United Kingdom 203, Canada 204, Japan 205, France 206, United States 207, Turkey 208, and India 209 may be listed in random order in the template 200. For explanation purposes, although the "Country" template 200 is shown to be different from ranked "Country" template 210, and integerized "Country" template 220, each of these templates refers to a single "Country" template that includes all the features in the "Country" template.

Next, the features Italy 202, United Kingdom 203, Canada 204, Japan 205, France 206, United States 207, Turkey 208, and India 209 may be ranked based on ranking criteria. Ranking criteria for ranking features may be, for example, a number of impressions, a number of occurrences, and the like. A ranking criterion may be a number of occurrences of a feature. A number of occurrences may be the number of received training examples in which the feature was included. For example, the system may have received 26 examples in which a user was located in the United States, and each example may have a label indicating that a user selected a search result. Based on these training examples, the feature "United States" may be given +26 added to the number of occurrences. Additionally, a rate of occurrence may be generated for a feature based on the number of occurrences out of a set number of training examples (e.g., over a set time period, over all time, etc.) received by the system. This occurrence rate may also be a ranking criterion.

Another ranking criterion may be a number of impressions associated with a feature. As mentioned above, a training example used for training a machine learning system typically contains a label corresponding to a resulting event or action (e.g., a user selected a search result, a user did not select the search result, a user viewed a video, etc.). An impression refers to a positive event or action as indicated by a label included in an example having one or more features. Referring to the example above, among the 26 received training examples in which a user was located in the United States, 24 of these training examples may have a label indicating that a user selected a particular search result. Accordingly, the feature "United States" may be given +24 added to the number impressions. In this case, 26 occurrences of the feature "United States" may be a low frequency in relation to the number of occurrences of other features; however, 24 impressions (e.g., click throughs) out of 26 occurrences may be a significant signal to a machine learning system. As another example, a training example may include an indication that a user viewed a particular video, i.e., a positive action. Features associated with this training example may be a video identification number of the video, a country in which the user is located, a language preferred by the user, a user's age group, and the like. Based on this training example, each of the features may be given a +1 based on the positive impression (i.e., label) that the user viewed the particular video. Accordingly, the number of impressions associated with a feature may be the total number of examples having a label indicating a positive event or action associated with the feature, received in training examples. In addition, a rate of impressions may be a ranking criterion. A rate of impressions may be generated for a feature based on the number of impressions out of the total number of occurrences of the feature. Any other ranking criteria may be used to rank the features in a template and the ranking criteria may be specifically based on a type of machine learning system and/or a type of training examples received by the system.

As shown in ranked template 210, the features United States 207, United Kingdom 203, India 209, Canada 204, Japan 205, France 206, Italy 202, and Turkey 208 may be ranked based on the ranking criteria. In the case of the number of occurrences of a feature as a ranking criterion, the features in ranked template 210 may be ranked in order of the most frequently occurring feature, e.g., United States 207, to the least frequently occurring feature, e.g., Turkey 208. Similarly, the features may be ranked based on the number of impressions, in which case, a feature having the highest number of impressions may be ranked first and the feature having the lowest number of impressions may be ranked last. In cases in which the ranking criterion includes multiple ranking sub-criteria or multiple criteria are used, a feature may be assigned a score for each ranking criterion (e.g., a number of occurrence, a number of impressions, etc.). The score for each ranking criterion may be combined to generate a total score for each feature. Accordingly, all the features in a template may be ranked based on the total score generated for each feature.

Based on this ranking of features in a template, it may be determined that a first set of features from among the multiple features associated with the template exceeds a threshold ranking criteria. In general, a threshold ranking criteria may be used to identify the higher ranked features relative to the other features in a template. In a machine learning system, a higher ranking may indicate that a feature is stored and/or processed often and the system may benefit from integerized representation of the feature to save on storage space and processing time. For example, the step of ranking features based on ranking criteria may identify features with a higher number of occurrences, a higher number of impressions, and the like, relative to other features in the template. As such, a threshold ranking criteria may be used to identify a first set of features, from among all the features in a template, which have a higher ranking compared to the other features based on the ranking criteria. A threshold ranking criteria may be based on a user setting, a system setting, a default setting, and the like. A threshold ranking criteria may be a minimum score, a number of occurrences, a number of impressions, and any other measure of ranking criteria. As an example, in the case where each feature in a template is assigned a score for each ranking criterion, a feature may exceed a threshold ranking criteria if its total score exceeds, for example, a score of 100. In this case, all features that have been determined to have a total score that exceeds 100 may be identified as being a feature in the first set of features. In an embodiment, a threshold may be set based on the rankings and/or scores assigned to features in the template, and/or the number of features in the template, such as by selecting a statistically-significant portion of the features. Additionally, a threshold ranking criteria may be a set number of features out of all the features in the template. For example, the threshold ranking criteria may be, for example, the five highest ranked features in a template. In which case, a total score assigned to a feature, the number of occurrences, the number of impressions, and the like may or may not matter in determining that a feature exceeds a threshold ranking criteria. For example, it may be determined that the first five features in a ranked template exceed the threshold ranking criteria regardless of the number of occurrences of each of the top five features.

As shown in ranked template 210, the features United States 207, United Kingdom 203, India 209, Canada 204, Japan 205, France 206, Italy 202, and Turkey 208 may be ranked based on the ranking criteria. Table 1 below shows the rankings and ranking criteria for each feature. For purposes of this example, the ranking criteria may include the number of occurrences and the number of impressions for each feature, although other criterion may be included in the ranking criteria. As shown, the features in ranked template 210 may be ranked in decreasing order of rank from top to bottom.

TABLE 1

| Template Ranked Features | Ranking Criteria | | |
|---|---|---|---|
| | Number of Occurrences | Number of Impressions | Total Score |
| United States 207 | 1306 | 865 | 2171 |
| United Kingdom 203 | 1298 | 843 | 2141 |
| India 209 | 1145 | 765 | 1910 |
| Canada 204 | 998 | 623 | 1621 |
| Japan 205 | 793 | 435 | 1228 |
| France 206 | 642 | 367 | 1009 |
| Italy 202 | 329 | 202 | 531 |
| Turkey 208 | 249 | 189 | 438 |

Based on the total scores for each feature shown in Table 1 above, it may be determined that a first set of features exceeds a threshold ranking criteria, e.g., any one or combination of a total score of 1500, a number of occurrences of 950, a number of impressions of 600, and the like. Based on any one or combination of these threshold ranking criteria, the first set of features may include United States 207, United Kingdom 203, India 209, and Canada 204. Alternatively, the threshold ranking criteria may be defined as the top five highest ranked features in a template, in which case, the first set of features may include United States 207, United Kingdom 203, India 209, Canada 204, and Japan 205. For purposes of this example, the first set of features may include United States 207, United Kingdom 203, India 209, and Canada 204, as shown in ranked template 210.

Since highly ranked features are stored and/or processed often, the system may benefit from using integerized representations of these features to save on storage space and processing time. As a result, an integer value may be assigned to each of the features in the first set of features in order based upon ranking. As shown in integerized template 220, each of the features United States 207, United Kingdom 203, India 209, and Canada 204 in the first set of features may be assigned an integer value. The integer value may replace the text string representing the feature, thereby reducing the amount of memory required to store and/or process the feature. Further, the integer value may be assigned to a feature in the first set of features based on the rank of the features in the first set of features. For example, the lowest integer value may be assigned to the highest ranked feature in the first set of features. As a result, for the highest ranked feature United States 207, the text string "United States" may be replaced with the lowest integer 0. Similarly, the text string "United Kingdom" may be replaced with the integer 1, the text string "India" may be replaced with the integer 2, and the text string "Canada" may be replaced with the integer 3, based on the decreasing rank of each feature.

The other features, i.e., the features not included in the first set of features, in a template may be handled according to various techniques. In some cases, it may be determined that a second set of features, e.g., the other features in the template, do not exceed the threshold ranking criteria. In some cases, it may be determined that a second set of features fall below a minimum threshold criteria. For example, in reference to Table 1 above, it may be determined that a second set of features falls below a minimum threshold ranking criteria, e.g., any one or combination of a total score of 1300, a number of occurrences of 800, a number of impressions of 500, and the like. Based on one or more of these minimum threshold ranking criteria, the second set of features may include Japan 205, France 206, Italy 202, and Turkey 208. As a result, Japan 205, France 206, Italy 202, and Turkey 208 may not be represented with integers and may remain in the integerized template 220 as text strings. Further, because low ranked features, e.g., infrequently occurring features, typically do not improve the modeling performance of a machine learning system, these low ranked features may be removed. Accordingly, these low ranked features Japan 205, France 206, Italy 202, and Turkey 208 may not even be stored and may be removed from the template "Country."

The implementations of the disclosed subject matter provided herein of methods and systems for using an integerized representation for large-scale machine learning data may be performed for multiple templates in a machine learning system. In this case, the integer values assigned to features in a template may be non-unique between templates. For example, although the feature United States 207 in the template "Country" may be assigned to the integer 0, a feature "English" in the template "Language" may also be assigned the integer 0. Accordingly, each column, e.g., a template, in a database may have its own dense integer space. Although the techniques, examples, tables, and figures discussed herein refer to a "Country" template, any template may be used in implementations of the disclosed subject. Similarly, the disclosed techniques may apply to any feature(s) in a machine learning system including any relevant ranking criteria used for ranking features in a template.

Implementations of the disclosed subject matter allow for encoding of features as integers in decreasing order based on the rank of the features in a template. By encoding features using variable-length integers, a machine learning system may store in-memory models and statistics as arrays rather than hash tables. Accordingly, the training data used by a machine learning system may be compressed more efficiently and compacted more quickly.

Figure 3:
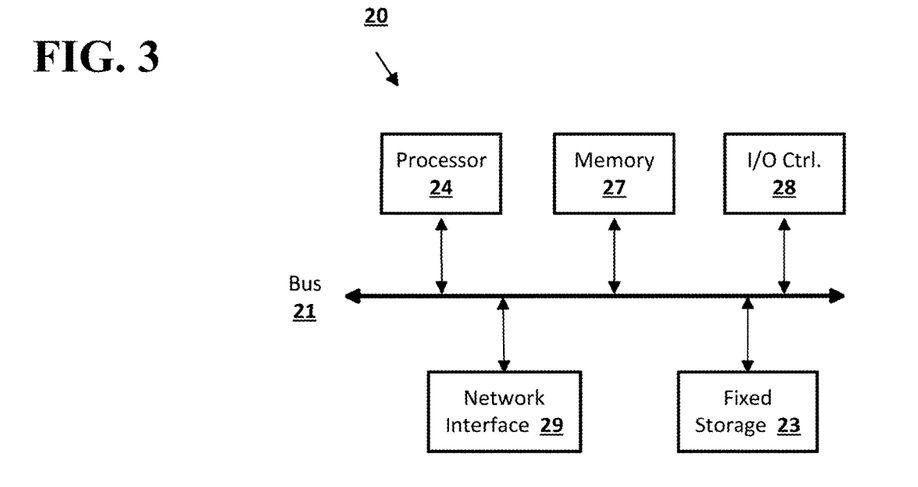
FIG. 3 shows a computer according to an embodiment of the disclosed subject matter.

Embodiments of the presently disclosed subject matter may be implemented in and used with a variety of component and network architectures. FIG. 3 is an example computer system 20 suitable for implementing embodiments of the presently disclosed subject matter. The computer 20 includes a bus 21 which interconnects major components of the computer 20, such as one or more processors 24, memory 27 such as RAM, ROM, flash RAM, or the like, an input/output controller 28, and fixed storage 23 such as a hard drive, flash storage, SAN device, or the like. It will be understood that other components may or may not be included, such as a user display such as a display screen via a display adapter, user input interfaces such as controllers and associated user input devices such as a keyboard, mouse, touchscreen, or the like, and other components known in the art to use in or in conjunction with general-purpose computing systems.

The bus 21 allows data communication between the central processor 24 and the memory 27. The RAM is generally the main memory into which the operating system and application programs are loaded. The ROM or flash memory can contain, among other code, the Basic Input-Output system (BIOS) which controls basic hardware operation such as the interaction with peripheral components. Applications resident with the computer 20 are generally stored on and accessed via a computer readable medium, such as the fixed storage 23 and/or the memory 27, an optical drive, external storage mechanism, or the like.

Each component shown may be integral with the computer 20 or may be separate and accessed through other interfaces. Other interfaces, such as a network interface 29, may provide a connection to remote systems and devices via a telephone link, wired or wireless local- or wide-area network connection, proprietary network connections, or the like. For example, the network interface 29 may allow the computer to communicate with other computers via one or more local, wide-area, or other networks, as shown in FIG. 4.

Many other devices or components (not shown) may be connected in a similar manner, such as document scanners, digital cameras, auxiliary, supplemental, or backup systems, or the like. Conversely, all of the components shown in FIG. 3 need not be present to practice the present disclosure. The components can be interconnected in different ways from that shown. The operation of a computer such as that shown in FIG. 3 is readily known in the art and is not discussed in detail in this application. Code to implement the present disclosure can be stored in computer-readable storage media such as one or more of the memory 27, fixed storage 23, remote storage locations, or any other storage mechanism known in the art.

Figure 4:
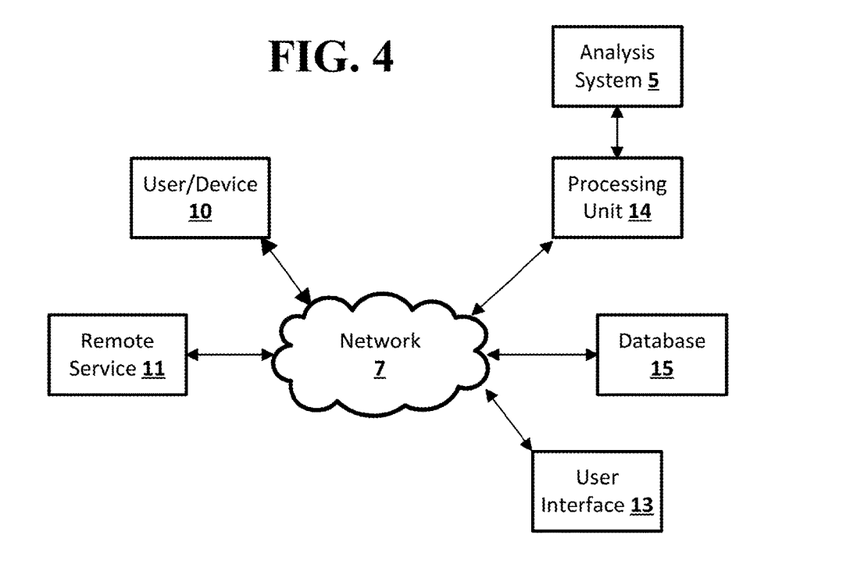
FIG. 4 shows a network configuration according to an embodiment of the disclosed subject matter.

FIG. 4 shows an example arrangement according to an embodiment of the disclosed subject matter. One or more clients 10, 11, such as local computers, smart phones, tablet computing devices, remote services, and the like may connect to other devices via one or more networks 7. The network may be a local network, wide-area network, the Internet, or any other suitable communication network or networks, and may be implemented on any suitable platform including wired and/or wireless networks. The clients 10, 11 may communicate with one or more computer systems, such as processing units 14, databases 15, and user interface systems 13. In some cases, clients 10, 11 may communicate with a user interface system 13, which may provide access to one or more other systems such as a database 15, a processing unit 14, or the like. For example, the user interface 13 may be a user-accessible web page that provides data from one or more other computer systems. The user interface 13 may provide different interfaces to different clients, such as where a human-readable web page is provided to web browser clients 10, and a computer-readable API or other interface is provided to remote service clients 11. The user interface 13, database 15, and processing units 14 may be part of an integral system, or may include multiple computer systems communicating via a private network, the Internet, or any other suitable network. Processing units 14 may be, for example, part of a distributed system such as a cloud-based computing system, search engine, content delivery system, or the like, which may also include or communicate with a database 15 and/or user interface 13. In some arrangements, an analysis system 5 may provide back-end processing, such as where stored or acquired data is pre-processed by the analysis system 5 before delivery to the processing unit 14, database 15, and/or user interface 13. For example, a machine learning system 5 may provide various prediction models, data analysis, or the like to one or more other systems 13, 14, 15.

More generally, various embodiments of the presently disclosed subject matter may include or be embodied in the form of computer-implemented processes and apparatuses for practicing those processes. Embodiments also may be embodied in the form of a computer program product having computer program code containing instructions embodied in non-transitory and/or tangible media, such as CD-ROMs, DVDs, hard drives, USB (universal serial bus) drives, flash drives, or any other machine readable storage medium, such that when the computer program code is loaded into and executed by a computer, the computer becomes an apparatus for practicing embodiments of the disclosed subject matter. Embodiments also may be embodied in the form of computer program code, for example, whether stored in a storage medium, loaded into and/or executed by a computer, or transmitted over some transmission medium, such as over electrical wiring or cabling, through fiber optics, or via electromagnetic radiation. When the computer program code is loaded into and executed by a computer, the computer becomes an apparatus for practicing embodiments of the disclosed subject matter. When implemented on a general-purpose microprocessor, the computer program code segments configure the microprocessor to create specific logic circuits. In some configurations, a set of computer-readable instructions stored on a computer-readable storage medium may be implemented by a general-purpose processor, which may transform the general-purpose processor or a device containing the general-purpose processor into a special-purpose device configured to implement or carry out the instructions. Embodiments may be implemented using hardware that may include a processor, such as a general purpose microprocessor and/or an Application Specific Integrated Circuit (ASIC) that embodies all or part of the techniques according to embodiments of the disclosed subject matter in hardware and/or firmware. The processor may be coupled to memory, such as RAM, ROM, flash memory, a hard disk or any other device capable of storing electronic information, as previously described. The memory or other storage medium may store instructions adapted to be executed by the processor to perform the techniques according to embodiments of the disclosed subject matter.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A method comprising:
receiving, by a data processing system, training data examples that contain a plurality of features for each of a plurality of templates, wherein each of the plurality of templates is a category of feature-types that includes multiple features, all of which are from the same category;

for each of the templates, preprocessing the features of the template in the training data examples, before processing the training data examples by a machine learning system, the preprocessing including, for each of the templates:
- ranking the plurality of features of the template based on a score, a number of impressions, a number of occurrences, a type of machine learning system, and a type of training examples received by the data processing system;
- determining a first set of features associated with the template, wherein each feature in the first set of features exceeds a threshold ranking criteria;
- determining a second set of features associated with the template, wherein each feature in the second set of features falls below a minimum threshold ranking criteria; and
- assigning an integer value to each feature of the first set of features in order based upon ranking; and before the training data examples are processed by the machine learning system, for each of the templates and each of the features in the first set of features associated with the template, replacing the feature in the training data with the integer value assigned to the feature, and removing from the training data each of the features of the template in the second set of features associated with the template.

2. The method of claim 1, wherein features in the received training data examples comprise text strings.

3. The method of claim 1, wherein assigning the integer value further comprises assigning the lowest integer value to the highest ranked feature in the first set of features.

4. The method of claim 3, wherein the lowest integer value is 1.

5. The method of claim 4, wherein integer values assigned to features are non-unique between templates.

6. The method of claim 1, wherein:
for each of the templates, the second set of features associated with the template is all the features other than the features in the first set of features associated with the template.

7. A data processing system comprising a computer configured to perform operations comprising:
receiving training data examples that contain a plurality of features for each of a plurality of templates, wherein each of the plurality of templates is a category of feature-types that includes multiple features, all of which are from the same category;

for each of the templates, preprocessing of the features of the template in the training data examples, before processing the training data examples by a machine learning system, the preprocessing including, for each of the templates:
- ranking the plurality of features of the template based on a score, a number of impressions, a number of occurrences, a type of machine learning system, and a type of training examples received by the data processing system;
- determining a first set of features associated with the template, wherein each feature in the first set of features exceeds a threshold ranking criteria;
- determining a second set of features associated with the template, wherein each feature in the second set of features falls below a minimum threshold ranking criteria; and
- assigning an integer value to each of the first set of features in order based upon ranking; and before the training data examples are processed by the machine learning system, for each of the templates and each of the features in the first set of features associated with the template, replacing the feature in the training data with the integer value assigned to the feature, and removing from the training data each of the features of the template in the second set of features associated with the template.

8. The system of claim 7, wherein features in the received training data comprise text strings.

9. The system of claim 7, wherein assigning the integer value further comprises assigning the lowest integer value to the highest ranked feature in the first set of features.

10. The system of claim 9, wherein the lowest integer value is 1.

11. The system of claim 10, wherein integer values assigned to features are non-unique between templates.

12. The system of claim 7, wherein:
for each of the templates, the second set of features associated with the template is all the features other than the features in the first set of features associated with the template.

13. The method of claim 1, further comprising:
processing the training data examples by the machine learning system.

14. The system of claim 7, wherein the operations further comprise:
processing the training data examples by the machine learning system.

15. One or more non-transitory computer-readable storage media encoded with instructions that, when executed by one or more computers, cause the one or more computers to perform operations comprising:
receiving training data examples that contain a plurality of features for each of a plurality of templates, wherein each of the plurality of templates is a category of feature-types that includes multiple features, all of which are from the same category;

for each of the templates, preprocessing the features of the template in the training data examples, before processing the training data examples by a machine learning system, the preprocessing including, for each of the templates:
- ranking the plurality of features of the template based on a score, a number of impressions, a number of occurrences, a type of machine learning system, and a type of training examples received by the data processing system;
- determining a first set of features associated with the template, wherein each feature in the first set of features exceeds a threshold ranking criteria;
- determining a second set of features associated with the template, wherein each feature in the second set of features falls below a minimum threshold ranking criteria; and
- assigning an integer value to each feature of the first set of features in order based upon ranking; and before the training data examples are processed by the machine learning system, for each of the templates and each of the features in the first set of features associated with the template, replacing the feature in the training data with the integer value assigned to the feature, and removing from the training data each of the features of the template in the second set of features associated with the template.

* * * * *